(12) United States Patent
Strus et al.

(10) Patent No.: US 6,647,080 B1
(45) Date of Patent: Nov. 11, 2003

(54) CARRIER PHASE INITIALIZATION WITH SUB-LSB ACCURACY

(75) Inventors: Joseph M. Strus, Cedar Rapids, IA (US); Jeffrey L. Tuohino, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/522,556

(22) Filed: Mar. 10, 2000

(51) Int. Cl.$^7$ .................. H04L 25/00; H04L 25/40; H04L 7/00
(52) U.S. Cl. ......................... 375/371; 375/226
(58) Field of Search .................. 375/371, 224, 375/226, 373; 701/214; 331/1, 17, 45

(56) References Cited

U.S. PATENT DOCUMENTS 5,899,957 A * 5/1999 Loomis ............... 701/214

* cited by examiner

*Primary Examiner*—Stephen Chin
*Assistant Examiner*—Curtis Odom
(74) *Attorney, Agent, or Firm*—Nathan O. Jensen; Kyle Eppele

(57) ABSTRACT

A method of and computer readable medium for obtaining sub least significant bit phase accuracy in a digitally controlled oscillator by choosing a phase angle, $\theta$; solving the base equation $Ap+Bq=1$ for A, wherein values of p and q are relatively prime components of a least significant bit; and computing a command value, k, from the command equation $k=A*\text{nint}(q\theta)\bmod(q)$.

8 Claims, 1 Drawing Sheet

---

Given DCO Resolution p/q, p and q Relatively Prime, Solve Ap + Bq = 1

↓

Given any Desired Initial Phase Angle, $\theta$, Compute k = A nint(q$\theta$) mod(q)

↓

Then, $\theta$ = Decimal Part of kp/q (to within +/−1/q)

Given DCO Resolution p/q, p and q Relatively Prime, Solve Ap + Bq = 1

↓

Given any Desired Initial Phase Angle, Θ, Compute k = A nint(qΘ) mod(q)

↓

Then, Θ = Decimal Part of kp/q (to within +/−1/q)

CARRIER PHASE INITIALIZATION WITH SUB-LSB ACCURACY

BACKGROUND OF THE INVENTION

A. Field of the Invention

The present invention is related to the carrier phase from a digitally controlled oscillator (DCO). More particularly this invention relates to obtaining accuracy of a carrier phase significantly less than the least significant bit (LSB).

B. Problems in the Art

The advent of carrier phase detection devices, particularly in the Global Positioning System (GPS) field, adds a high impetus to develop an accurate, yet low cost, method of simulating carrier phases down to sub-millimeter carrier phase accuracy.

To achieve this accuracy, very high quality, and therefore higher cost, phase control hardware is used. Alternatively, a special high rate processing that provides phase by averaging is used. However, this latter methodology of essentially averaging between two consecutive Least Significant Bit (LSB) phases, thus simulating a phase angle between these two, not only requires significant processing overhead, but typically exhibits "jitter" or a "waver" between the two phase angles truly present and the desired phase angle simulated by the processing.

An LSB is typically expressed as a numerator (p) and a denominator (q), wherein p and q are relatively prime, which gives a $\Delta$.

$$\Delta = \frac{p}{q} \qquad \text{Eq. 1}$$

and thus producing an error range of p/q, as shown in FIG. 2. Therefore writing a 1 to the carrier DCO gives a phase change of $\Delta$. Therefore subsequent DCO commands would give:

TABLE 1

Command Effects on Phase Angle

| Command | Angle |
|---|---|
| 0 | 0 |
| 1 | $\Delta$ |
| 2 | $2\Delta$ |
| 3 | $3\Delta$ |
| 4 | $4\Delta$ |
| 5 | $5\Delta$ |
| 6 | $6\Delta$ |

For example, in the above case, to simulate a phase angle of $\Delta/2$, one would switch between a 1 and a 0 command in a one to one ratio. If a phase angle of $\Delta/4$ is desired, a command of 0 is entered for a time period three times as long as a command of 1. Clearly, other angles can be "simulated" by averaging, but it would take significant processing and the "jittering" effect would be exhibited from this averaging method.

SUMMARY OF THE INVENTION

The present invention includes a method for determining an appropriate value to be entered into a digitally controlled oscillator to achieve better than least significant bit accuracy.

The present invention also includes a computer readable medium having computer executable instructions for causing a computer to determine an appropriate value to be entered into a digitally controlled oscillator to achieve better than least significant bit accuracy.

This is done by: choosing a desired phase angle $\theta$; solving the base equation $$Ap+Bq=1 \qquad \text{Eq.2}$$

for A, wherein the values of p and q are relatively prime components of an LSB; and computing a command value, k, from the command equation $$k=[A\text{int}(q\theta)]\text{mod}(q) \qquad \text{Eq.3}$$

From this k value, an appropriate command value can be entered. On most DCOs it will be the command value itself. However those skilled in the art will appreciate different requirements for different DCOs and will appreciate the relationship between the k value and the value to be entered into the DCO.

DETAILED DESCRIPTION OF THE PREFERRED EMBODIMENT

Figures 1, 2:
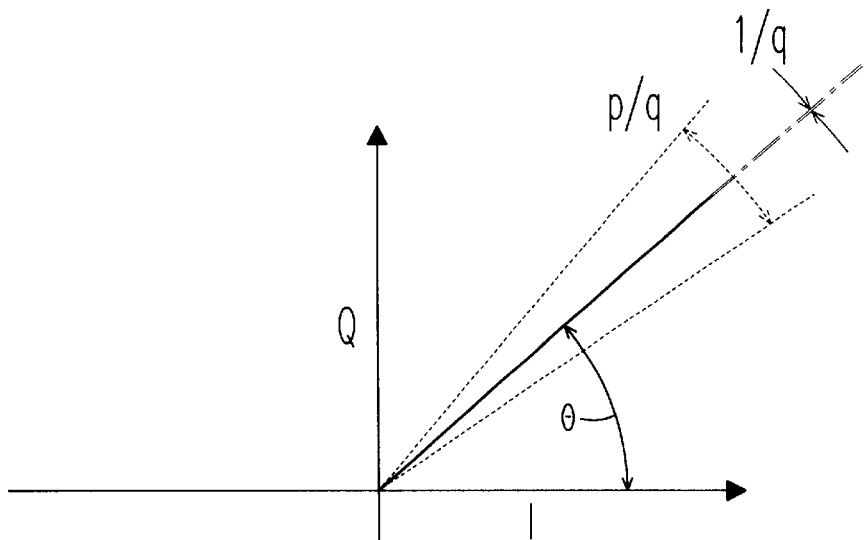
FIG. 1 is a flowchart illustrating an embodiment of the methodology of initializing the carrier phase of a DCO.
FIG. 2 is an illustration of the initialized phase with prior error range of p/q, as compared to the error range of the invention of 1/q.

To assist in understanding the invention, a preferred embodiment will now be described. The method obtains sub-millimeter carrier phase accuracy from a Digitally Controlled Oscillator (DCO). It utilizes the principle that a phase is identical to another phase with an integer number of cycles added or subtracted to that phase. For example, a phase of 1.75° is equivalent to a phase of 361.5°. Or more broadly, 1.75° is equivalent to $$1.75°+N(360°) \qquad \text{Eq.4}$$

where N is an integer.

As 360° is equal to one cycle, therefore any angle $\theta$, in terms of cycles N, is $$\theta=\theta_N+N \qquad \text{Eq.5}$$

where N is an integer.

With this in mind, any angle $\theta$, can be written as $$\theta=\theta_N\text{mod}(1) \qquad \text{Eq.6a}$$

where, $$a\,\text{mod}(b) = a - \text{int}\left[\frac{b}{a}\right]*a \qquad \text{Eq. 6b}$$

and int ( ) is the greatest integer function.

When applying this principal to a DCO, those of skill in the art will appreciate that the multiples of $$\left(\frac{p}{q}\right) \mod(1) \qquad \text{Eq. 7}$$

may not immediately repeat. These multiples can form a uniform partition of one phase cycle with steps of the size 1/q, where the signal generator constants p and q are relatively prime.

Therefore, when it is desired to find the appropriate command value (k) and given θ, where 0≦θ<1 as discussed above, find k so that $$\theta = \left[\left(k * \frac{p}{q}\right) \mod(1)\right] \qquad \text{Eq. 8}$$

is minimized. Therefore, we must solve $$\theta = \left(\frac{kp}{q}\right) \mod(1) \qquad \text{Eq. 9a}$$

or, $$\text{nint}(\theta q) = (k_p) \mod(q) \qquad \text{Eq. 9b}$$

where nint ( ) is the nearest integer function.

Such a solution provides a carrier phase resolution of less than 1/q cycles.

As shown in FIG. 1, given the DCO resolution is p/q, and p and q are relatively prime, we solve for:

$$Ap+Bq=1 \qquad \text{Eq. 10}$$

then solve for $$k=[A\text{int}(q\theta)]\mod(q) \qquad \text{Eq. 11}$$

The angle is then the decimal part of kp/q to within ±1/q, as shown in FIG. 2. The solution can be found by using the Euclidean Algorithm.

Solving an Euclidean Algorithm is within the skill of those skilled in the art. While not essential to the L understanding of this invention, a brief tutorial follows:

If $a,b \in Z^+$, then $a = q_1 b + r_1$ $b = q_2 r_1 + r_2$ $r_1 = q_3 r_2 + r_3$

. . .

$r_i = q_{i+2} r_{i+1} + r_{i+2}$

. . .

$r_{k-3} = q_{k-1} r_{k-2} + r_{k-1}$ $r_{k-2} = q_k r_{k-1} + r_k$ $r_{k-1} = q_{k+1} r_k \qquad \text{Eq. 12}$ Then $r_k$, the last non-zero remainder, equals the greatest common devisor of a and b (gcd(a,b)). It is within the skill of those skilled in the art to convert this to a computer implemented program such as Pascal program below:

```
Program EuclideanAlgortihm (input, output); Var
  a,b,c,d,r: integer;
Begin
  Writeln('We wish to determine the greatest common');
  Writeln('divisor of two positive integers a,b.');
  Write('a=');
  Read(a);
  Write ('b=');
  Read(b);
  r:=a Mod b;
  d:=b;
  While r>0
    Begin
      c:=d;
      d:=r;
      r:=c Mod d
    End;
  Writeln ('The greatest common divisor of', a:0, 'and');
  Write (b:0, 'is', d:0)
End.
```

Solving for a chosen θ

$$k=A*\text{int}(q\theta)\mod(q) \qquad \text{Eq.13}$$

This should be solvable in less than A multiplications. Or, if floating point math is acceptable, then a single line solution can be found by:

$$k = A*\text{int}(q\theta) - \text{int}\left(\frac{A*\text{int}(q\theta)}{q}\right)*q \qquad \text{Eq. 14}$$

It should be noted that not only will this method be applicable to GPS systems, but also in Direct Digital Synthesis (DDS) devices and components, for example, cell phones and radios. This invention is also applicable to any device containing a phase based on a form of a Least Significant Bit.

The preceding embodiment is given by way of example only, and not by way of limitation to the invention. The true essence and spirit of this invention are defined in the appended claims, and is not intended that the embodiment of the invention preceding should limit the scope thereof. It will be appreciated that the present invention can take many forms and embodiments. Variations obvious to one skilled in the art will be included within the invention defined by the claims.

What is claimed is:

1. A method of obtaining sub least significant bit phase accuracy in simulating a carrier phase signal with a digitally controlled oscillator comprising the steps of:

choosing a phase angle, θ;
solving the base equation $$Ap+Bq=1$$

for integers A and B, wherein values of p and q are relatively prime components of a least significant bit; and computing a command value, k, from the command equation $$k=A*\text{nint}(q\theta)\mod(q); \text{ and}$$

using said command value k to simulate a carrier phase signal.

2. The method of claim 1 further comprises the step of entering the appropriate command indicated by said command value, k, into said digitally controlled oscillator.

3. The method of claim 1 wherein said base equation solution uses an Euclidean algorithm.

4. The method of claim 3 wherein said value of p represents a numerator of said least significant bit and said value of q represents a corresponding denominator of said least significant bit.

5. A system for simulating a carrier phase signal comprising:

a computer readable medium having computer executable instructions for causing a computer to perform the step of:

solving the base equation $$Ap+Bq=1$$

for integers A and B, wherein values of p and q are relatively prime components of a least significant bit; and computing a command value, k, for a value θ, from the command equation $$k=A*\text{nint}(q\theta)\bmod(q); \text{ and}$$

a digitally controlled oscillator configured to generate a simulated carrier phase signal when said commanded by said command value k.

6. The medium of claim 5 wherein said base equation solution uses an Euclidean algorithm.

7. The medium of claim 6 wherein said value of p represents a numerator of said least significant bit and said value of q represents a corresponding denominator of said least significant bit.

8. The medium of claim 5 wherein said θ is a desired phase angle.

* * * * *